(12) United States Patent
Terao

(10) Patent No.: US 7,382,000 B2
(45) Date of Patent: Jun. 3, 2008

(54) SEMICONDUCTOR DEVICE

(75) Inventor: Kohtaro Terao, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 10/592,444

(22) PCT Filed: Mar. 28, 2005

(86) PCT No.: PCT/JP2005/005690

§ 371 (c)(1),
(2), (4) Date: Sep. 8, 2006

(87) PCT Pub. No.: WO2005/117116

PCT Pub. Date: Dec. 8, 2005

(65) Prior Publication Data

US 2007/0158682 A1    Jul. 12, 2007

(30) Foreign Application Priority Data

May 31, 2004    (JP) .............................. 2004-162055

(51) Int. Cl.
*H01L 31/111*    (2006.01)
*H05K 7/20*    (2006.01)

(52) U.S. Cl. .............................. 257/177; 257/E23.051; 257/E23.044; 257/E23.052; 257/E23.101; 257/E25.029; 257/E25.206; 257/E25.016; 257/E25.03; 257/675; 257/712; 361/712

(58) Field of Classification Search ................ 257/675, 257/177, 712, 713, 717, 720, E23.051, E23.044, 257/E23.052, E23.106, E23.03, E23.101, 257/E25.016, E25.029; 361/712
See application file for complete search history.

(56) References Cited

U.S. PATENT DOCUMENTS 5,739,581 A  *  4/1998  Chillara et al. ............. 257/668

(Continued)

FOREIGN PATENT DOCUMENTS

JP    4-93159    8/1992

(Continued)

OTHER PUBLICATIONS

Machine translation for JP 2004-146628.*

(Continued)

*Primary Examiner*—Alexander Oscar Williams
(74) *Attorney, Agent, or Firm*—Bachman & LaPointe, P.C.

(57)    ABSTRACT

A semiconductor device is provided which comprises a connecting lead 4 mounted between a MOS-FET 1 and a regulatory IC 2 on a support plate 3. Connecting lead 4 has a thermally radiative and electrically conductive substrate 6 and electrically insulative and thermal transfer-resistive covering 7. Substrate 6 has one end 6a providing one main surface 4a of connecting lead 4 which is mounted and electrically connected on the other main surface 1b of MOS-FET 1. Covering 7 provides the other main surface 4b of connecting lead 4 for supporting regulatory IC 2 at one end 6a of substrate 6. When electric current flow is supplied to MOS-FET 1 through an electrified path of support plate 3 and substrate of connecting lead 4, heat produced from operating MOS-FET 4 is effectively radiated through support plate 3 and substrate 6 of connecting lead 4 to improve thermal radiation in the semiconductor device in the layered structure of the semiconducting elements while heavy current can flow through MOS-FET 1 due to sufficient heat radiation.

3 Claims, 4 Drawing Sheets

U.S. PATENT DOCUMENTS

2002/0003294 A1* 1/2002 Bissey ................... 257/676

FOREIGN PATENT DOCUMENTS

| JP | 2001-110986 | 4/2001 |
|---|---|---|
| JP | 2004-6564 | 1/2004 |
| JP | 2004-146628 | 5/2004 |

OTHER PUBLICATIONS

Machine translation for JP 2004-146628, May 20, 2004 date publication.*

* cited by examiner

SEMICONDUCTOR DEVICE

TECHNICAL FIELD

This invention relates to a semiconductor device, in particular, of the type which has semiconducting elements on their reduced plane occupation area so that the semiconductor device has the excellent thermally radiative property even in its narrowed plane size.

BACKGROUND OF THE INVENTION

A semiconductor device is known which has an integral package of a power semiconducting element and a regulatory IC for controlling the power semiconducting element. As shown in FIG. 8, the semiconductor device of this type comprises a support plate 3; a power semiconducting element 21 mounted on support plate 3; a layered structure of a regulatory IC 22 mounted on power semiconducting element 21 or, as shown in FIG. 9, an apposed structure of a regulatory IC 22 secured on support plate 3 away from power semiconducting element 21. For example, FIG. 4 of Japanese Patent No. 2,566,207 discloses a semiconductor device of such a layered structure.

Such a semiconductor device naturally requires the semiconducting structure of good thermally radiative property because power semiconducting element 21 eradiates a larger amount of heat than regulatory IC 22 does. However, semiconductor device shown in FIG. 8 cannot indicate good thermally radiative property due to the less heat discharging performance because heat emitted from power semiconducting element 21 is discharged to outside only through support plate 3. In some cases, it would be preferable to thermally isolate regulatory IC 22 from power semiconducting element 21, especially in view of the function of semiconductor device which involves heating power semiconducting element 21 and power-saving regulatory IC 22. In this case, there would be a risk of disadvantageously deteriorating the electric property of regulatory IC 22 which may be overheated by heat directly transferred to regulatory IC 22 from power semiconducting element 21.

On the other hand, in semiconductor device of the apposed structure shown in FIG. 9 wherein power semiconducting element 21 and regulatory IC 22 are juxtaposed on support plate 3, it is possible to prevent direct heat transmission from power semiconducting element 21 to regulatory IC 22, however, it is still defective due to the inferior heat radiation since heat is inadequately discharged from power semiconducting element 21 to outside only through support plate 3. The apposed structure of FIG. 9 also has an additional disadvantage because it requires larger plane size of semiconductor device in the apposed structure of power semiconducting element 21 and regulatory IC 22 on support plate 3.

An object of the present invention is to provide a semiconductor device which has semiconducting elements stacked in the layered structure with an excellent thermally radiative property.

SUMMARY OF THE INVENTION

The semiconductor device according to the present invention comprises a thermally radiative and electrically conductive support plate (3); a first semiconducting element (1) having one main surface (1a) which is mounted and electrically connected on support plate (3); a thermally radiative and electrically conductive connecting lead (4) having one main surface (4a) which is mounted and electrically connected on the other main surface (1b) of first semiconducting element (1); a second semiconducting element (2) mounted on the other main surface (4b) of connecting lead (4); and a plurality of lead terminals (5) disposed adjacent to support plate (3). Connecting lead (4) bridges and electrically joins between at least one (5a) of lead terminals (5) and the other main surface (1b) of first semiconducting element (1). Thus, the semiconductor device can be made by piling first semiconducting element (1), connecting lead (4) and second semiconducting element (2) in turn on the reduced plane occupation area of support plate (3) for densified mounting of semiconducting elements in the semiconductor device.

Also, as heat-releasing and conductive connecting lead (4) spans between at least one (5a) of lead terminals (5) and first semiconducting element (1), heat generated from first semiconducting element (1) during the operation is effectively and fully discharged to outside through two heat transmission channels of support plate (3) and connecting lead (4) to one (5a) of lead terminals (5). Connecting lead (4) serves also to function as a current path to or from first semiconducting element (1) so that relatively large electric current can flow through connecting lead (4) for heavy current capacity and simplified wiring. In addition, connecting lead (4) bridging between connecting lead (4) and lead terminal (5a) has a mechanical strength enough to prevent deformation or warpage of connecting lead (4) when a pressure of encapsulant resin is applied during the transfer molding process of a lead frame assembly for encapsulation, thus completely avoiding an undesirable electrical contact between connecting lead (4) and support plate (3).

In an embodiment of the present invention, interposed between the other main surface (4b) of connecting lead (4) and second semiconducting element (2) is a lagging (7) which comprises an electrically insulating layer (7a) and an adiabatic layer (7b) to restrict or prohibit heat transfer from first semiconducting element (1) to second semiconducting element (2) due to thermal insulation by lagging (7).

EFFECT OF THE INVENTION

The present invention can provide a semiconductor device of smaller or narrowed plane size due to the reduced plane occupation area of semiconducting elements. Also, heat generated from first semiconducting element can be well radiated, and first and second semiconducting elements can be thermally isolated from each other so that operating heat from first semiconducting element never deteriorates electric property of second semiconducting element to provide durable and reliable semiconductor devices.

BRIEF DESCRIPTION OF THE DRAWINGS

The above-mentioned and other objects and advantages of the present invention will be apparent from the following description in connection with preferred embodiments shown in the accompanying drawings wherein.

EXPLANATION OF SYMBOLS IN DRAWINGS (1) a first semiconducting element (a MOS-FET), (1a) one main surface, (1b) the other main surface, (2) a second semiconducting element (a regulatory IC), (3) a support plate, (4) a connecting lead, (4a) one main surface, (4b) the other main surface, (4c) a ramp, (5) lead terminals, (5a) a lead terminal, (5b) lead terminals, (6) a substrate, (6a) one end, (6b) the other end, (7) a lagging, (7a) a dielectric layer, (7b) an adiabatic layer, (8) lead wires.

BEST MODE FOR CARRYING OUT THE INVENTION

Embodiments will be described hereinafter in connection with FIGS. 1 to 7 of the drawings regarding the semiconductor device according to the present invention applied to a power semiconductor device for use in a switching regulator.

Figure 1:
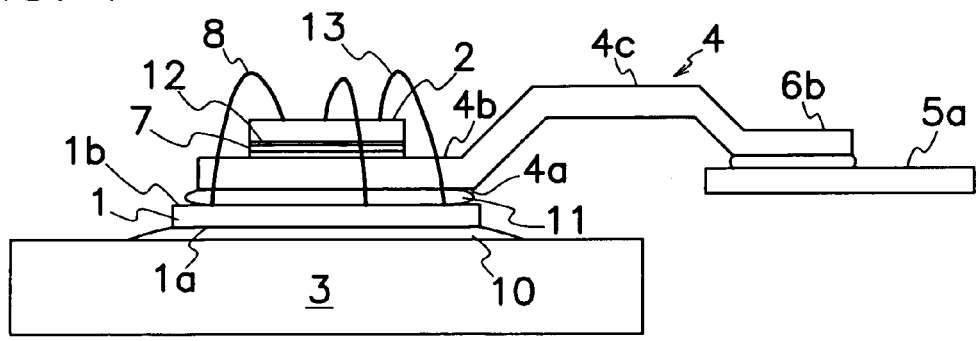
FIG. 1 is a side elevation view of the semiconductor device according to the present invention before packaging by plastic encapsulation.
Figure 2:
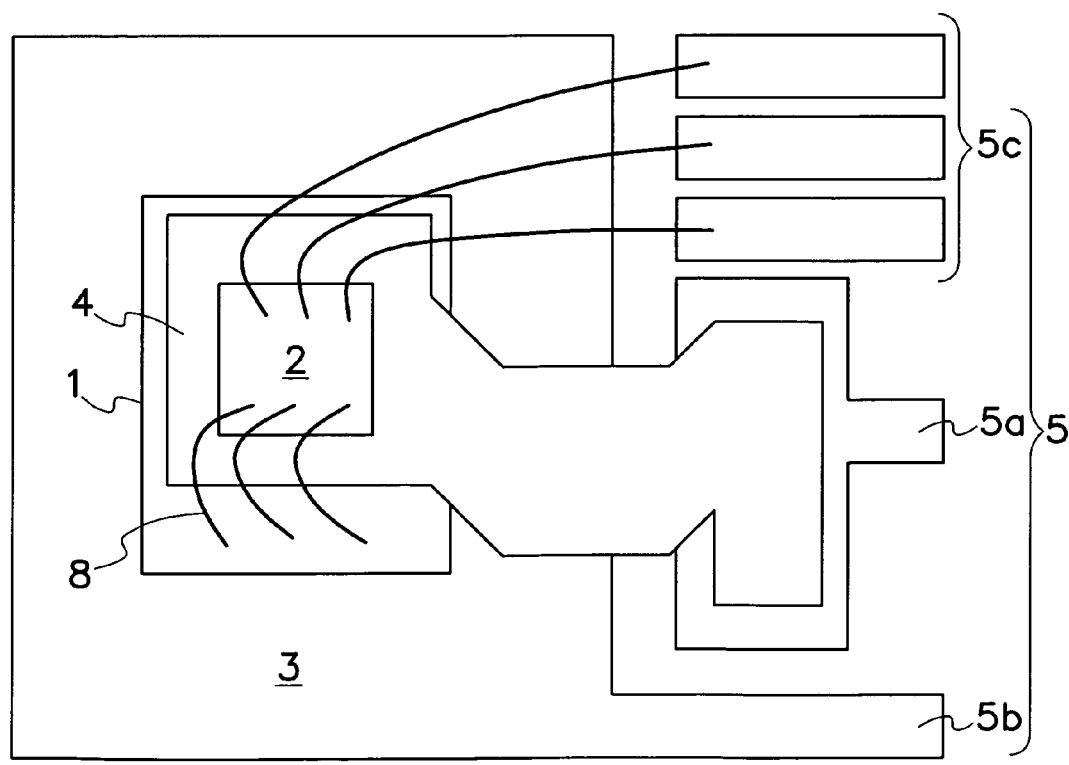
FIG. 2 is a plan view of the semiconductor device shown in FIG. 1.

As shown in FIG. 1, the semiconductor device according to the present invention comprises a MOS-FET 1 as a first semiconducting element or switching element whose one main surface 1a is mounted or secured on a support plate 3 through an electrically conductive adhesive or solder 10. Formed of nickel-plated, thermally radiative and electrically conductive metal such as copper or aluminum is support plate 3 to which one main electrode of MOS-FET 1 is electrically connected. The other main electrode, namely source electrode is formed on the other main surface 1b of MOS-FET 1 on the opposite side of support plate 3, and a connecting lead 4 is attached on source electrode of MOS-FET 1 via electrically conductive adhesive or solder 11.

Figure 3:
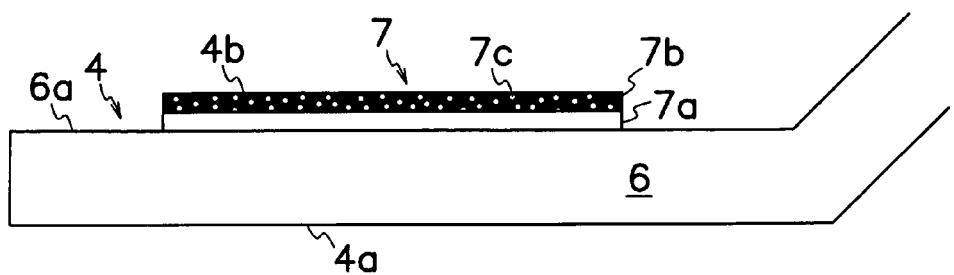
FIG. 3 is a sectional view of an embodiment showing a lagging on a connecting lead.

As shown in FIG. 3, connecting lead 4 comprises a substrate 6 formed of thermally radiative and electrically conductive metal such as copper or aluminum, and one end 6a of substrate 6 is connected to source electrode of MOS-FET 1, the other end 6b of substrate 6 is connected to a lead terminal 5a through a solder 13. Substrate 6 comprises one main surface 4a connected to source electrode of MOS-FET 1 and lead terminal 5a, and the other surface 4b to which a second semiconducting element, namely regulatory IC 2 is applied. One and the other ends 6a and 6b of substrate 6 are disposed parallel to each other but at different heights due to the different heights of the other main surface 1b of MOS-FET 1 and lead terminal 5a so that connecting lead 4 has a ridge or bump 4c to compensate the difference in level between the other main surface 1b of MOS-FET 1 and lead terminal 5a, while positioning one and the other ends 6a and 6b of substrate 6 respectively on the other main surface 1b of MOS-FET 1 and lead terminal 5a. Bump 4c of connecting lead 4 shown in FIG. 1 is formed into a trapezoidal shape of three sides without the base, however, bump 4c may be formed into one or combination of various shapes upwardly away from support plate 3.

One end 6a of connecting lead 4 is wider than bump 4c so that one end 6a can serve to provide an area for supporting regulatory IC 2 and a thermally radiative plate for discharging heat from MOS-FET 1, and a lagging 7 is formed on the other main surface 4b. Lagging 7 has a two-layered structure which comprises an electrically insulative and dielectric layer 7a attached to substrate 6, and a thermally insulative or adiabatic layer 7b of high heat transfer resistance, secured on dielectric layer 7a for supporting regulatory IC 2 on adiabatic layer 7b. Dielectric layer 7a is formed of for example polyimide resin such as KAPTON® film of non-porous or pinhole-free insulating resin, and has its inherent adhesive property which bonds dielectric layer 7a on a surface of one end 6a of connecting lead 4. Otherwise, an adhesive tape may be attached to a bottom surface of dielectric layer 7a to adhere dielectric layer 7a on one end 6a of connecting lead 4 through adhesive tape. Adiabatic layer 7b is formed of foamed or expandable plastics such as polyimide foam. Resistance against heat transfer through foamed adiabatic layer 7b is greater than that of substantially foamless dielectric layer 7a so that lagging 7 effectively prevents heat produced from MOS-FET 1 from traveling to regulatory IC 2. Although heat transfer resistance of lagging 7 increases if dielectric layer 7a is formed of foamed plastics similarly to adiabatic layer 7b, inconsistently and concurrently, whole electrical insulation of lagging 7 is deteriorated to fail to establish a reliable electrical insulation between connecting lead 4 and regulatory IC 2.

Figure 4:
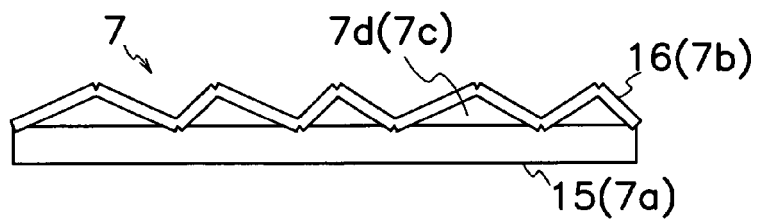
FIG. 4 is a sectional view showing an embodiment of manufacturing the lagging.
Figure 5:
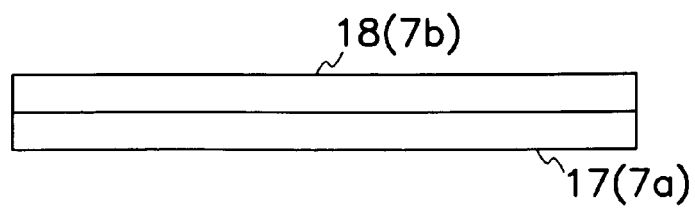
FIG. 5 is a sectional view showing another embodiment of manufacturing the lagging.

FIG. 4 shows a first preparation of lagging 7 by fusing a corrugated resinous film 16 on an adhesive plastic tape 15 under pressure to form voids 7d at given intervals between plastic tape 15 as a dielectric layer 7a and resinous film 16 as an adiabatic layer 7b. FIG. 5 illustrates a second preparation of lagging 7 by heating and joining a resinous covering film 18 on a resinous foamless base plate 17 under pressure wherein covering film 18 contains a foaming agent to provide an adiabatic layer 7b, and base plate 17 provides a dielectric layer 7a without foaming agent so that foaming agent in covering film 18 expands during heating to form gas bubbles 7c.

Control IC 2 is secured on adiabatic layer 7b via an adhesive agent 12 disposed therebetween. Adhesive agent 12 may be omitted if adiabatic layer 7b has the own adhesive property. A gate terminal of MOS-FET 1 is connected to an electrode not shown of regulatory IC 2 through a lead wire 8 striding across connecting lead 4. A plurality of electrodes not shown on regulatory IC 2 are electrically connected to corresponding ones 5c of lead terminals 5 disposed near support plate 3. A lead terminal 5b is formed integrally with support plate 3 to provide an electrified path so that electric current, namely main or drain current of MOS-FET 1 flows through support plate 3 and lead terminal 5b.

Thus, this embodiment can provide a semiconductor device in a smaller plane size incorporated with semiconducting elements, namely MOS-FET 1 and regulatory IC 2 of their smaller plane occupation area by piling and bonding in turn MOS-FET 1, connecting lead 4 and regulatory IC 2 on support plate 3 to form the stacked structure into a lead frame assembly. In this case, plane area of the other main surface 1b of MOS-FET 1 is preferably designed to be larger than plane area on one end 6a of connecting lead 4 which is designed to be larger than plane area of regulatory IC 2 to facilitate wiring and bonding of lead wires 8 and connecting lead 4.

In operation, drive pulses are applied from regulatory IC 2 through lead wire 8 to gate terminal of MOS-FET 1 to repetitively turn MOS-FET 1 on and off under control of regulatory IC 2. During the on-period of MOS-FET 1, drain current passes through support plate 3, MOS-FET 1 and connecting lead 4 between lead terminals 5b and 5a while MOS-FET 1 emits heat which can effectively and sufficiently be released from support plate 3 through solder 10 and simultaneously also discharged from lead wire 5a through solder 11 and substrate 6. This means that the obtained semiconductor device has the ample radiation performance and can send heavy electric current into MOS-FET 1. In this case, it should be noted that no heat is transferred to regulatory IC 2 although MOS-FET 1 produces increased amount of heat since lagging 7 of connecting lead 4 perfectly shuts off heat from MOS-FET 1. In addition, the device can prevent short circuit accident by undesirable electrical communication between MOS-FET 1 and regulatory IC 2 since dielectric layer 7a accomplishes a complete electric insulation between MOS-FET 1 and regulatory IC 2. As above-mentioned, lagging 7 has three functions for firstly firmly joining connecting lead 4 and regulatory IC 2, secondly thermally isolating MOS-FET 1 and regulatory IC 2 from each other, and thirdly electrically insulating MOS-FET 1 and regulatory IC 2 from each other. Also, the arrangement has the featured structure of connecting lead 4 which bridges and electrically joins between one lead terminal 5a and the other main surface 1b of MOS-FET 1 to electrically connect the other end 6b of connecting lead's substrate 6 to lead terminal 5a. Lead frame assembly of the above stacked structure is sealed with a plastic encapsulant in a well-known transfer molding technique, and at that time, melt resin pressure for encapsulation is applied to each part of lead frame assembly. Connecting lead 4 has the resistance to deformation by applied melt resin pressure during the transfer molding, thereby positively avoiding unfavorable electrical contact between connecting lead 4 and support plate 3 or other parts.

Figure 6:
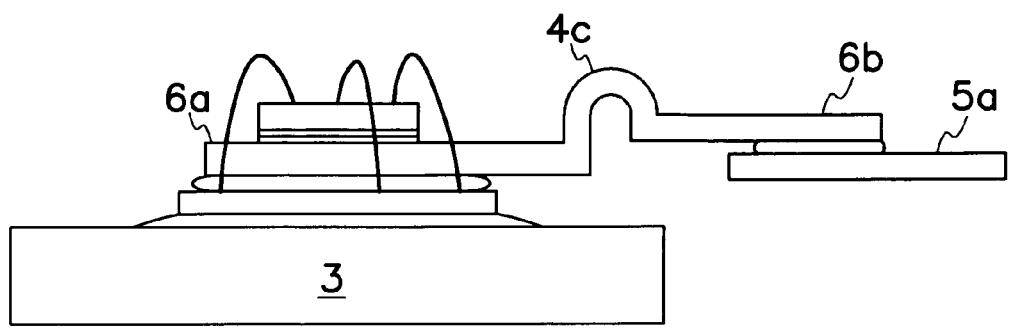
FIG. 6 is a side elevation view of a second embodiment showing the semiconductor device according to the present invention before packaging by plastic encapsulation.
Figure 7:
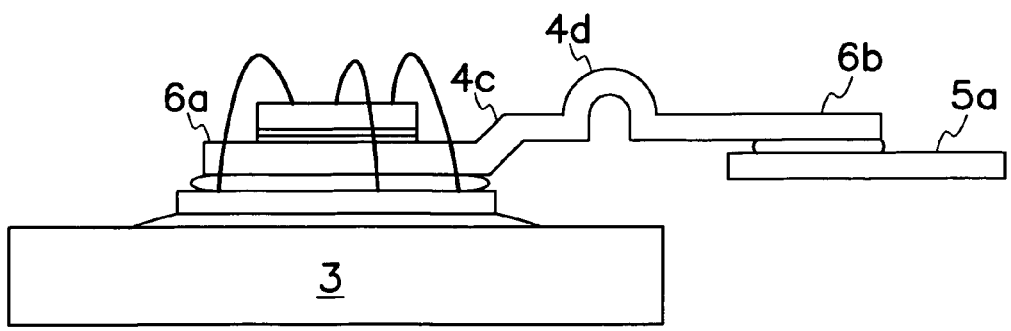
FIG. 7 is a side elevation view of a third embodiment showing the semiconductor device according to the present invention before packaging by plastic encapsulation.
Figure 8:
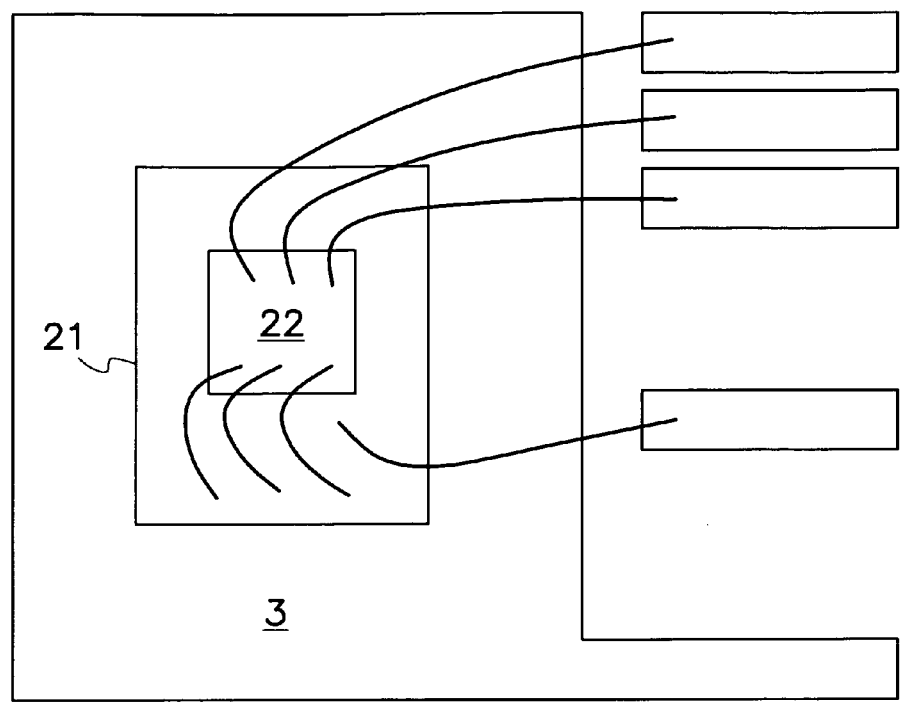
FIG. 8 is a plan view of a prior art semiconductor device.
Figure 9:
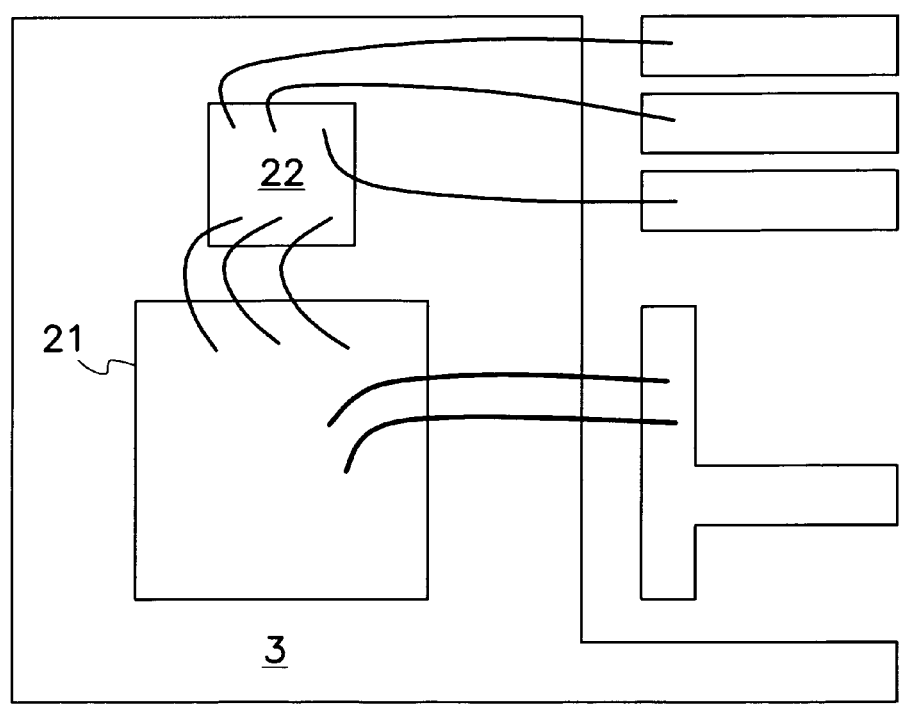
FIG. 9 is a plan view of another prior art semiconductor device.

The above-mentioned embodiments of the present invention may be varied. For example, bump 4c of connecting lead 4 may be formed into an inverted J-shape as shown in FIG. 6. Also, an inverted U-shaped bend 4d may be formed in slant bump 4c. These inverted J-shaped bump 4c or U-shaped bend 4d serve to alleviate or absorb external force to lead terminals 5, support plate 3 or MOS-FET 1.

INDUSTRIAL APPLICABILITY

The present invention is particularly applicable to a semiconductor device of highly densified mounting which produces a large amount of heat.

What is claimed is:

1. A semiconductor device comprising:
   a thermally radiative and electrically conductive support plate;
   a first semiconducting element having one main surface which is mounted on and electrically connected to said support plate;
   a thermally radiative and electrically conductive connecting lead having one main surface which is mounted and electrically connected on an other main surface of said first semiconducting element;
   an insulative covering disposed on the other main surface (4b) of said connecting lead;
   a second semiconducting element mounted on said insulative covering;
   a plurality of lead terminals disposed adjacent to said support plate, wherein said connecting lead bridges and electrically joins between at least one of said lead terminals and the other main surface of said first semiconducting element; and
   said insulative covering comprises an electrically insulative layer and a thermally adiabatic layer to restrict heat transfer from the first semiconducting element to the second semiconducting element.

2. The semiconductor device of claim 1, wherein said insulative layer comprises a dielectric film which has a porosity or gas-bubble content, and said adiabatic layer comprises a dielectric film which has a porosity or gas-bubble content greater than that of said dielectric film.

3. The semiconductor device of claims 1 or 2, wherein said insulative layer is attached to said connecting lead, and said adiabatic layer is attached to the second semiconducting element.

* * * * *